(12) United States Patent
McDougall et al.

(10) Patent No.: US 6,239,957 B1
(45) Date of Patent: May 29, 2001

(54) CURRENT LIMITING DEVICE

(75) Inventors: Ian Leitch McDougall, Oxon; Peter Hanley, Gloucestershire, both of (GB)

(73) Assignee: Oxford Instruments (UK) Ltd., Oxon (GB)

( * ) Notice: Subject to any disclaimer, the term of this patent is extended or adjusted under 35 U.S.C. 154(b) by 0 days.

(21) Appl. No.: 08/931,486

(22) Filed: Sep. 16, 1997

(30) Foreign Application Priority Data

Oct. 10, 1996 (GB) .................................................. 9621142

(51) Int. Cl.[7] .............................. H01B 12/00; H02H 7/00
(52) U.S. Cl. .................... 361/19; 335/216; 505/885; 174/15.4
(58) Field of Search .......................... 335/216; 174/15.4, 174/15.5; 338/325; 361/19; 505/879, 884–887

(56) References Cited

U.S. PATENT DOCUMENTS

| | | | |
|---|---|---|---|
| 3,141,979 | 7/1964 | Rinia et al. | 327/366 |
| 3,308,310 | 3/1967 | Burnett | 327/366 |
| 3,324,436 | 6/1967 | Mueller | 338/325 |
| 3,394,335 | 7/1968 | Buchhold | 505/881 |
| 3,488,617 | 1/1970 | Dietrich et al. | 505/862 |
| 3,835,239 | 9/1974 | Schmidt et al. | 174/15.4 |
| 3,925,707 | 12/1975 | Bhate et al. | 361/3 |
| 4,375,659 | 3/1983 | Cunningham et al. | 361/19 |
| 4,692,560 * | 9/1987 | Hotta et al. | 174/15.4 |
| 4,700,257 | 10/1987 | Bekhaled | 361/19 |
| 4,855,859 | 8/1989 | Tixador et al. | 361/19 |
| 4,994,932 * | 2/1991 | Okamoto et al. | 361/19 |
| 5,153,803 | 10/1992 | Rapeaux et al. | 361/19 |
| 5,241,447 | 8/1993 | Barber et al. | 361/141 |
| 5,379,020 | 1/1995 | Meier et al. | 505/211 |
| 5,414,586 | 5/1995 | Hara et al. | 361/19 |
| 5,432,666 * | 7/1995 | Hodge | 361/19 |
| 5,469,711 * | 11/1995 | McCoy | 62/51.1 |
| 5,475,560 | 12/1995 | Onihsi et al. | 361/141 |
| 5,546,261 | 8/1996 | Yoshida et al. | 361/19 |
| 5,694,279 * | 12/1997 | Mumford | 361/19 |
| 5,757,257 * | 5/1998 | Doi et al. | 335/216 |

FOREIGN PATENT DOCUMENTS

| | | |
|---|---|---|
| 0 315 976 | 5/1989 | (EP) . |
| 2 691 591 | 11/1993 | (FR) . |
| 1230579 | 5/1971 | (GB) . |
| 1-185128 | 7/1989 | (JP) . |
| 1-206834 | 8/1989 | (JP) . |
| WO 94/03955 | 2/1994 | (WO) . |

\* cited by examiner

*Primary Examiner*—Ramon M. Barrera

(57) ABSTRACT

An electrical current limiting device comprises an electrical superconductor for attachment in an electrical circuit. The superconductor achieves a superconducting condition at relatively high temperatures. A cooling system includes a motor for flowing a cooled gas past the superconductor so that heat can be removed from the superconductor by a heat transfer process with the cooled gas.

3 Claims, 3 Drawing Sheets

CURRENT LIMITING DEVICE

BACKGROUND OF THE INVENTION

1. Field of the Invention

The invention relates to a current limiting device.

2. Description of the Related Art

Current limiting devices are used in a wide variety of applications to handle fault conditions when a current surges above a safe limit. In high current applications such as power supply lines and the like, it has been known in the past to pass the current through a coil which is provided about a leg of an iron former. Another leg of the former provides the core of a superconducting coil which is activated to hold the iron former in a saturated condition. Thus, under normal conditions, the iron is saturated and so effectively the coil carrying the current sees an air core. When a fault occurs, the current rises causing a consequent increase in the magnetic field generated by the coil which opposes the field due to the superconducting coil. This causes an increase in the permeability of the iron core and this increases the voltage across the coil carrying the current which limits the current being carried.

Although this current fault limiter is effective, it is very expensive due to the need to provide the iron core and the complexities due to the need to cool the superconducting coil to liquid helium temperatures.

More recently, it has been proposed to use a superconducting switch. In this case, a length of high temperature (HTc) superconductor is placed into the circuit carrying the current. HTc materials have a critical temperature which is relatively high (typically equivalent to a liquid nitrogen temperature) and have a critical current (strictly current density) which varies inversely with an applied magnetic field. If the current carried by the superconductor exceeds the critical current then the material of the conductor makes a transition to a resistive state which acts to limit the current being carried. The critical current value at which this transition occurs can be changed by changing the applied magnetic field.

In U.S. patent application Ser. No. 08/737,080 we describe a current limiting device which can be controlled to recover from a resistive state without terminating the flow of current.

In all these devices, in order to achieve the superconducting condition, the superconductor must be cooled to or below its critical temperature. Conventionally, this is achieved by immersing the superconductor in a boiling liquid coolant, or by passing such a coolant past the superconductor. In the case of high temperature superconductors, the liquid is typically nitrogen which boils at 77K.

One of the problems with this approach to cooling the superconductor is that the rate of heat transfer varies significantly depending upon the temperature difference between the liquid nitrogen and the superconductor. As can be seen in FIG. 1, when the superconductor has a temperature in the region of 77K, the boiling point of liquid nitrogen, the rate of heat transfer to the boiling liquid is high as indicated in a region 21 in FIG. 1. However, at higher temperatures as indicated in the region 22, the rate of heat transfer suddenly drops to much lower values as the cooled surface becomes occluded by a film of gas (Monroe et al, J. Applied Physics, p619 (1952)). This can lead to a risk of break down of the device since heat cannot be transferred away sufficiently quickly. The result is that the temperature of the superconductor must be very carefully controlled to stay within the region 21, which is undesirable.

SUMMARY OF THE INVENTION

In accordance with the present invention, an electrical current limiting device comprises an electrical superconductor for attachment in an electrical circuit, the superconductor achieving a superconducting condition at a relatively high temperature; and a cooling system including means for flowing a cooled gas past the superconductor so that heat can be removed from the superconductor by a heat transfer process with the cooled gas.

In contrast to the known arrangements described above, the invention makes use of the forced flow of a gas. As we will show below, heat transfer to a moving gas does not exhibit very different transfer regimes in contrast to the regimes 21, 22 of a boiling liquid and this has the advantage that the temperature of the superconductor can be controlled over a much wider range than has been possible previously. Furthermore, the apparatus needed to provide the cooling gas is much simpler and thus cheaper, while the temperature to which the superconductor is cooled can be controlled by varying the gas flow rate. Typically, the system will stabilize at a temperature differential of about 20K.

The use of forced gas flow allows greater temperature excursions when the superconductor becomes resistive, without sacrificing heat transfer, so as to prevent burn out, and allow recovery. Furthermore, operating temperatures can be used which are inaccessible using boiling liquids. This broadens the choice of superconducting materials, and frees the designer to choose critical current densities which would not otherwise be possible.

Heat transfer to moving gas can be approximately described by:

$$Nu = 0.023 Re^{0.8} Pr^{0.4}$$

$$Nu = \text{Nusselt number} = \frac{hD}{k}$$

$$Re = \text{Reynold's number} = \frac{\rho v D}{\eta}$$

$$Pr = \text{Prandtl number} = \frac{C_p \eta}{K}$$

where
  h=heat transfer coefficient
  D=Hydraulic diameter of duct
  K=thermal conductivity
  ρ=density
  v=velocity
  η=viscosity
  $C_p$=specific heat.

Some representative values are tabulated below for helium and neon at 25 bar:

TABLE 1

|  | D m | K W/m^2/K | dens kg/m^3 | T K | pres bar | V m/s | viscos Ns/m^2 | Re | Pr | h w/m^2/K |
|---|---|---|---|---|---|---|---|---|---|---|
| Helium | 1.00E−02 | 6.00E−02 | 1.96E+01 | 60 | 25 | 1.00E+01 | 7.00E−06 | 2.80E+05 | 7.50E−01 | 2.80E+03 |
| Neon | 1.00E−02 | 1.70E−02 | 9.79E+01 | 60 | 25 | 1.00E+01 | 1.10E−05 | 8.90E+05 | 7.80E−01 | 2.04E+03 |

Although the heat transfer coefficients h quoted above are lower than those achievable with a boiling liquid, this is compensated for by the fact that a much larger temperature difference is possible between the cooling gas and the superconductor with the result that heat transfer coefficients in the region of 50000 W/m$^2$ could be achieved.

The cooling system could comprise any conventional system such as a refrigeration system or the like. Preferably, however, the cooling system comprises a closed loop around which gas flows and having compression and expansion means for cooling the gas, the loop extending through or past the superconductor.

With this arrangement, effectively the process gas of a refrigerator is used to cool the superconductor. There is no need for a separate refrigeration system to cool the gas which is then subsequently flowed past the superconductor. This again simplifies construction and complexity and thus reduces cost.

Typically, the compression and expansion means are controllable to adjust the temperature of the gas and hence the temperature to which the superconductor is cooled.

The gas can be any conventional refrigerant but will typically be an inert gas such as helium or neon.

The superconductor can comprise any conventional superconductor which superconducts at a relatively high temperature. By "relatively high temperature" we mean temperatures above those of liquid helium (4K), currently known high temperature superconduct superconducting at temperatures at or below 77K. A preferred example is YBa$_2$Cu$_3$O$_7$ although other materials such as Nb$_3$Sn (Tc≈18K) operating at 10K could be used.

In some applications the electrical superconductor will be connected in series in the electrical circuit. In other applications, the electrical superconductor forms the secondary of a transformer and is short-circuited, the primary being connected in the electrical circuit.

BRIEF DESCRIPTION OF THE DRAWINGS

Some examples of a current limiting device according to the invention will now be described with reference to the accompanying drawings, in which.

DETAILED DESCRIPTION OF THE EMBODIMENTS

Figure 1:
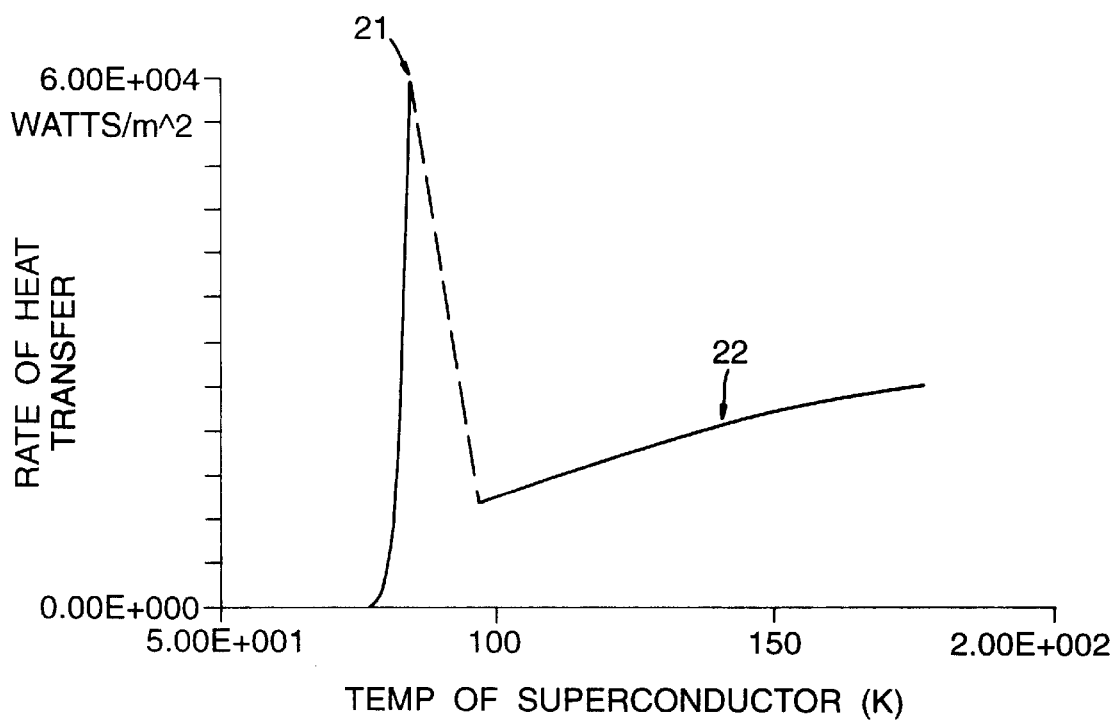
FIG. 1 illustrates graphically the variation in rate of heat transfer to boiling liquid nitrogen with temperature.
Figure 2:
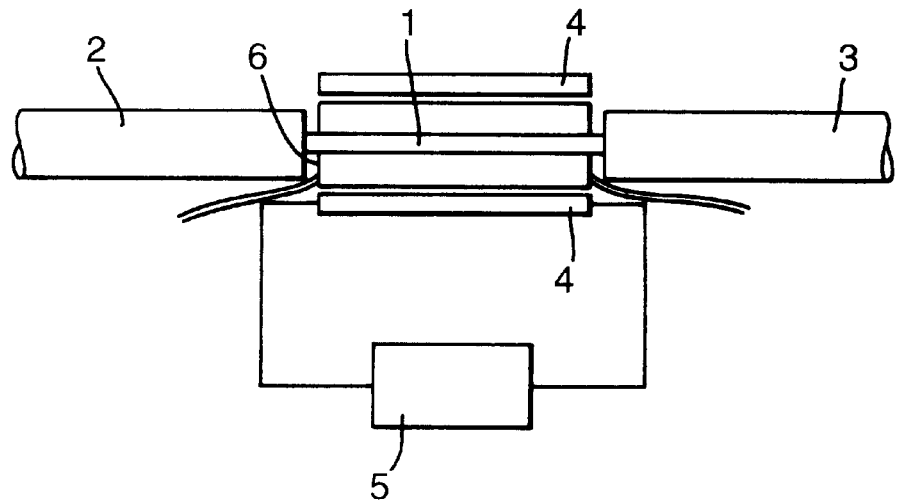
FIG. 2 is a schematic, block diagram of a first embodiment of a current limiting device.

The fault current limiting device shown in FIG. 2 comprises a wire 1 of high temperature superconductor such as YBa$_2$Cu$_3$O$_7$ extending between cables 2,3 of an electric circuit (not shown). The superconductor 1 can be connected to a shunt impedance (not shown) and is positioned in a cooling chamber 6 of a refrigerator system 30 (FIG. 4) to maintain the temperature of the superconductor below its critical temperature (ca 85K). A magnet 4 is positioned about the superconductor 1 and is connected to a power source and control device 5.

Figure 5:
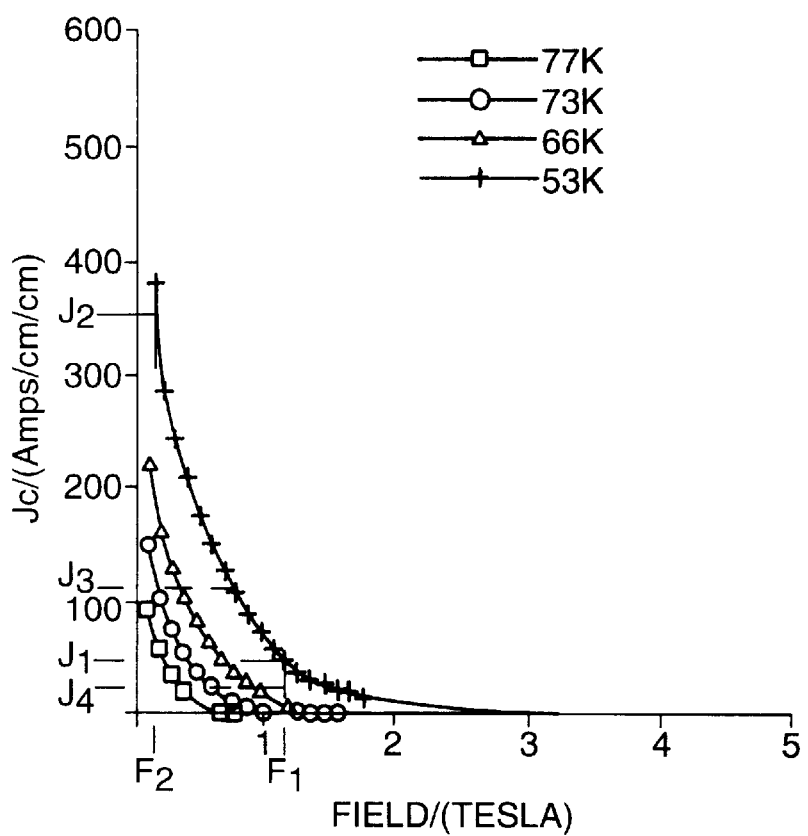
FIG. 5 illustrates the variation of critical current density with field at various temperatures of a typical high temperature superconductor.

In normal operation, the control device 5 is controlled to generate a current through the magnet 4 so that the magnet generates a steady magnetic field $F_1$ and this will define a critical current density $J_1$ (FIG. 5). Providing current flowing through the superconductor 1 is below the critical current density $J_1$, the superconductor 1 will remain in its superconducting state. However, if a fault develops causing a current surge, the current will rise above the critical current density $J_1$, for example to a value $J_3$, causing the superconductor 1 to revert to its resistive state. In this state, the superconductor acts to limit the flow in current as required.

When it is desired to cause the superconductor 1 to return to its superconducting state, when the conducted current has returned to a normal level $J_4$, the control device 5 is instructed to reduce the applied magnetic field either to zero or to a low value $F_2$. As described in U.S. Ser. No. 08/737,080, this will cause a rapid increase in the critical current to a value $J_2$. At this level, the current $J_4$ passing through the superconductor 1 is sufficiently low relative to the critical current that the superconductor 1 reverts to its superconducting state. The magnetic field is then controlled by the controller 5 to return to its normal level $F_1$.

Figure 3:
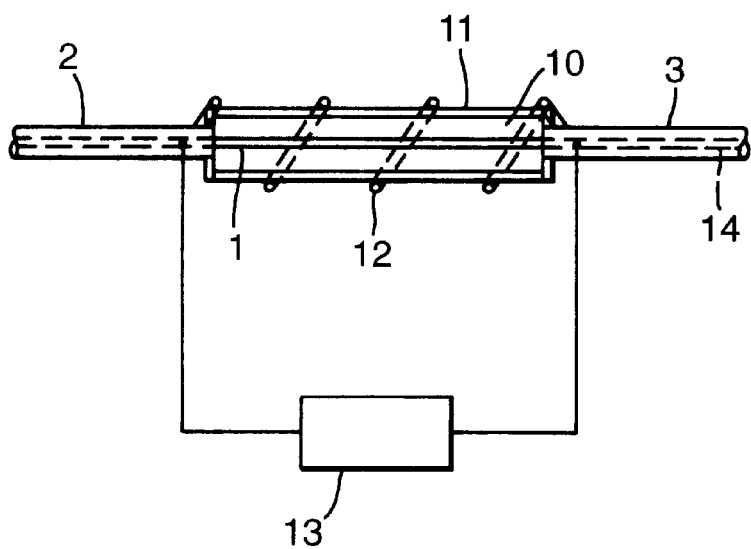
FIG. 3 is a schematic, block diagram of a second embodiment of a current limiting device.

FIG. 3 illustrates a second example of a fault current limiting device. In this case, the superconductor 1 comprises a semiconducting substrate 10, for example a high resistance alloy on which is provided a thin film of high temperature superconducting material 11. As before, cables 2,3 are connected to the superconductor 1. A shunt coil 12 is wound around the superconductor 1 and is connected electrically in parallel with the superconductor 1. In addition, the shunt coil 12 is connected to a switch 13 which is normally open. In this case cooling medium is supplied through the centre of the substrate 10 via a conduit 14 of a refrigeration system similar to that shown in FIG. 4.

In this example, as current increases, the self-field due to the current in the superconductor 1 will cause the critical current density to lower so that the superconductor sheds current into the coil 12. This shed current flows in the coil 12 (which is resistive) causing a magnetic field to be generated to which the superconductor 1 is exposed thereby decreasing still further the critical current density. As before, a point is reached at which the superconductor changes into its resistive state with the superconductor 1 and shunt coil 12 forming a high impedance. When the current demanded has returned to its normal level, the superconductor 1 can be turned back to its superconducting state by closing the switch 13 for a short moment thereby removing the magnetic field.

Figure 4:
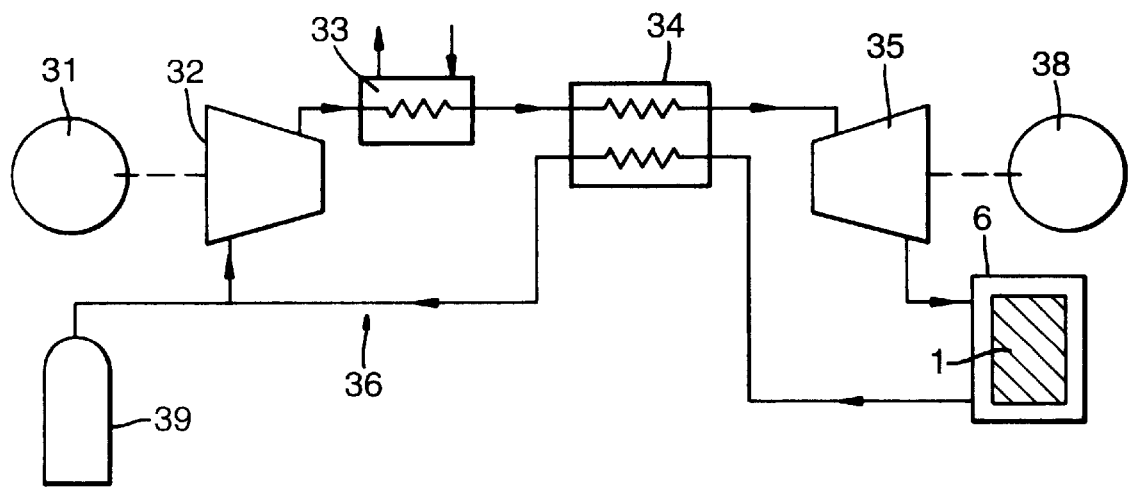
FIG. 4 illustrates the cooling system shown in FIG. 2, in more detail.

An example of a refrigeration system for use with the FIG. 2 example and which can be adapted for the FIG. 3 example is shown in FIG. 4. The system has a generally conventional construction and comprises a motor 31 connected to a compressor 32. The compressor 32 is connected into a closed loop system 36 formed by various conduits, as shown, joined together with the components in the system. An inert gas such as neon or helium is circulated through the closed loop 36 in the direction of the arrows. The compressor 32 is connected to a heat exchanger 33 which removes the heat of the compression, using water or air cooling. The cooled gas then passes to a further heat exchanger 34 for heat exchange with counterflowing, returning process gas. The gas from the heat exchanger 34 then passes to an expansion engine 35 such as a turbine connected to a brake or generator 38. The gas, now fully cooled, passes into the cooling chamber 6. This forced flow of gas through the cooling chamber 6 removes heat from the superconductor 1, as described previously, and the heated gas flows back through the heat exchanger 34 for heat exchange with the gas passing in the opposite direction and from there back to the compressor 32. A gas source 39 is provided connected to the loop 36 to allow for additional gas to be supplied in the case of system cooling.

In the examples described, the superconductor 1 has been shown used in conjunction with control magnets and the like. However, it should be understood that the use of these control magnets is optional and in the simplest arrangement, the fault limiting device comprises just the superconductor 1 and cooling chamber 6.

We claim:

1. A current limiting device, comprising:

a high temperature superconductor connected to an electrical circuit, the high temperature superconductor having a critical temperature and a critical current density, the critical current density varying with an applied magnetic field;

a cooling system including a device to flow a cooled gas past the high temperature superconductor to maintain the temperature of the superconductor at or below the critical temperature;

a magnetic field applying device to apply a magnetic field to the high temperature superconductor to define a critical current density, the magnetic field applying device comprising a shunt coil wound around the superconductor; and a control device to control the magnetic field applying device to apply the magnetic field to the high temperature superconductor, wherein the superconductor limits current flow in response to a current flow in the superconductor greater than the critical current density, and wherein the control device includes a normally open switch connected to the shunt coil, wherein the superconductor sheds current into the shunt coil to generate a magnetic field, and the magnetic field is removed by closing the switch.

2. A device as recited in claim 1, wherein the cooling system is a forced flow cooling system which controls the amount of heat removed from the superconductor by controlling the gas flow rate.

3. A device as recited in claim 2, wherein the cooling system is a closed loop refrigeration system around which the gas flows.

* * * * *